United States Patent
Zhou et al.

(10) Patent No.: US 9,620,235 B2
(45) Date of Patent: Apr. 11, 2017

(54) SELF-TIMER FOR SENSE AMPLIFIER IN MEMORY DEVICE

(71) Applicant: Silicon Storage Technology, Inc., San Jose, CA (US)

(72) Inventors: Yao Zhou, Shanghai (CN); Kai Man Yue, Shanghai (CN); Xiaozhou Qian, Shanghai (CN); Bin Sheng, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/772,047

(22) PCT Filed: Mar. 15, 2013

(86) PCT No.: PCT/CN2013/072666
§ 371 (c)(1),
(2) Date: Sep. 1, 2015

(87) PCT Pub. No.: WO2014/139138
PCT Pub. Date: Sep. 18, 2014

(65) Prior Publication Data
US 2016/0019972 A1   Jan. 21, 2016

(51) Int. Cl.
*G11C 16/06* (2006.01)
*G11C 16/28* (2006.01)
*G11C 7/08* (2006.01)
*G11C 8/18* (2006.01)
*G11C 16/26* (2006.01)
*G11C 16/24* (2006.01)
*G11C 16/32* (2006.01)
*G11C 7/22* (2006.01)

(52) U.S. Cl.
CPC ............... *G11C 16/28* (2013.01); *G11C 7/08* (2013.01); *G11C 7/227* (2013.01); *G11C 8/18* (2013.01); *G11C 16/24* (2013.01); *G11C 16/26* (2013.01); *G11C 16/32* (2013.01)

(58) Field of Classification Search
CPC ......... G11C 16/28; G11C 16/26; G11C 16/24; G11C 16/32; G11C 7/08; G11C 7/06
USPC ..................................... 365/185.21
See application file for complete search history.

(56) References Cited

U.S. PATENT DOCUMENTS

| | | | |
|---|---|---|---|
| 5,198,997 A | 3/1993 | Arakawa | |
| 5,386,158 A | 1/1995 | Wang | |
| 5,910,914 A | 6/1999 | Wang | |
| 6,128,226 A * | 10/2000 | Eitan | G11C 7/14 365/185.2 |
| 7,161,855 B2 * | 1/2007 | Kodama | G11C 7/227 365/194 |

(Continued)

FOREIGN PATENT DOCUMENTS

| | | |
|---|---|---|
| CN | 1670861 A | 9/2005 |
| CN | 102254567 A | 11/2011 |

(Continued)

OTHER PUBLICATIONS

PCT Search Report and Written Opinion corresponding to the related PCT Patent Application No. CN2013/072666 dated Dec. 26, 2013.

*Primary Examiner* — Toan Le
(74) *Attorney, Agent, or Firm* — DLA Piper LLP (US)

(57) ABSTRACT

A self-timer for a sense amplifier in a memory device is disclosed.

13 Claims, 4 Drawing Sheets

(56) References Cited

U.S. PATENT DOCUMENTS

| | | | |
|---|---|---|---|
| 2002/0145918 A1* | 10/2002 | Maayan | G11C 7/062 365/189.07 |
| 2009/0175074 A1 | 7/2009 | Theoduloz et al. | |
| 2011/0286271 A1* | 11/2011 | Chen | G11C 7/1006 365/185.09 |
| 2012/0195109 A1 | 8/2012 | Nori | |

FOREIGN PATENT DOCUMENTS

| | | |
|---|---|---|
| EP | 1 291 880 | 3/2003 |
| JP | 3-71495 | 3/1991 |
| JP | 2006-31752 | 2/2006 |

* cited by examiner

SELF-TIMER FOR SENSE AMPLIFIER IN MEMORY DEVICE

TECHNICAL FIELD

A self-timer for a sense amplifier in a memory device is disclosed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

Read operations usually are performed on floating gate memory cells using sense amplifiers. A sense amplifier for this purpose is disclosed in U.S. Pat. No. 5,386,158 (the "'158 Patent"), which is incorporated herein by reference for all purposes. The '158 Patent discloses using a reference cell that draws a known amount of current. The '158 Patent relies upon a current mirror to mirror the current drawn by the reference cell, and another current mirror to mirror the current drawn by the selected memory cell. The current in each current mirror is then compared, and the value stored in the memory cell (e.g., 0 or 1) can be determined based on which current is greater.

Another sense amplifier is disclosed in U.S. Pat. No. 5,910,914 (the "'914 Patent"), which is incorporated herein by reference for all purposes. The '914 Patent discloses a sensing circuit for a multi-level floating gate memory cell or MLC, which can store more than one bit of data. It discloses the use of multiple reference cells that are utilized to determine the value stored in the memory cell (e.g., 00, 01, 10, or 11).

Sense amplifiers often utilize a reference memory cell that is compared to a selected memory cell to determine the contents of the selected memory cell. The selected memory cell is selected in part through the assertion of a corresponding bit line. The bit line will include inherent capacitance. This can affect the timing and accuracy of the sense amplifier.

What is needed is an improved sense amplifier that compensates for the inherent capacitance of the bit line to improve the accuracy of sense amplifiers in a flash memory device.

SUMMARY OF THE INVENTION

The aforementioned problems and needs are addressed through the embodiments described below. A timing generator is disclosed. The timing generator receives a pre-charged bit line and a reference cell that emulates an actual selected memory cell. The timing generator generates a signal that can be used to enable the sense data operation.

DETAILED DESCRIPTION OF THE PREFERRED EMBODIMENTS

Figure 1:
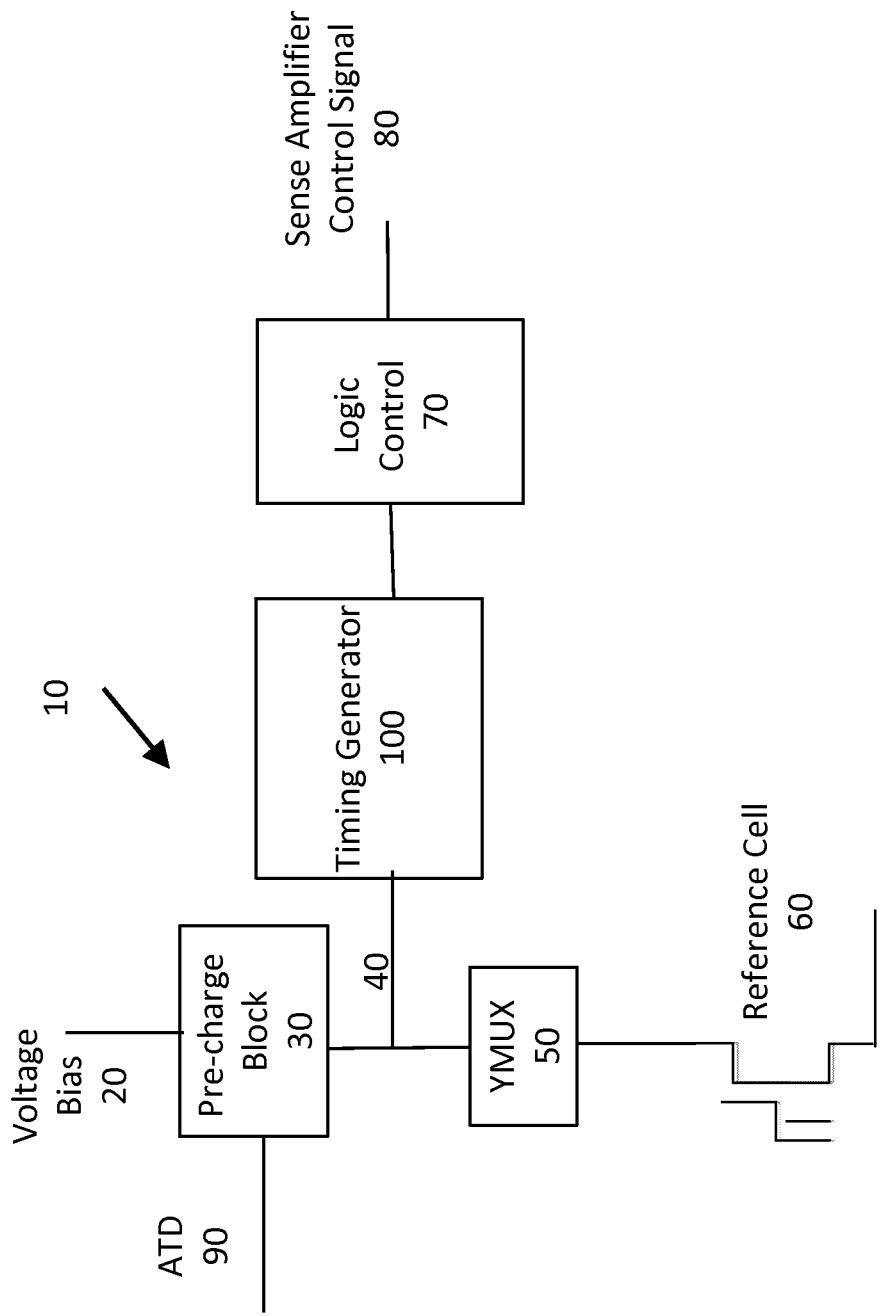
FIG. 1 depicts an embodiment for generating a sense amplifier control signal using a timing generator.

An embodiment will now be described with reference to FIG. 1. Control circuit 10 receives an ATD signal 90, which is an "Address Transition Detection" signal indicating that an address has been presented for a read operation from a flash memory array (not shown). Control circuit 10 comprises pre-charge block 30, which receives Voltage Bias 20, which is a voltage source. Pre-charge block outputs a voltage at node 40. Control circuit 10 further comprises reference cell 60, which is a "dummy" memory cell that emulates the memory cells in the flash memory array (not shown) with which the sense amplifier will be used. Reference memory cell 60 is coupled to YMUX (Y Multiplexer) 50, which in turn is connected to node 40. YMUX 50 is the same type of multiplexer used to read data from the flash memory array.

Control circuit 10 further comprises timing generator 100 that receives node 40 as an input. The output of timing generator 100 is coupled to logic control 70, and the output of logic control 70 is sense amplifier control signal 80. Sense amplifier control signal 80 is used to trigger a read operation from the flash memory array.

Using sense amplifier control signal 80 instead of ATD signal 90 (as is the case in the prior art) can lead to a more accurate sense operation because the timing of sense amplifier control signal 80 is affected by the reference cell current of reference cell 60 and the capacitance of YMUX 50, which emulate the effect of the selected memory cell and a bit line during a read operation from the memory array. Thus, sense amplifier control signal 80 encompasses the same timing variations that are inherent in the sensing of data from the memory array and therefore will be better matched to the data sense operation.

Figure 2:
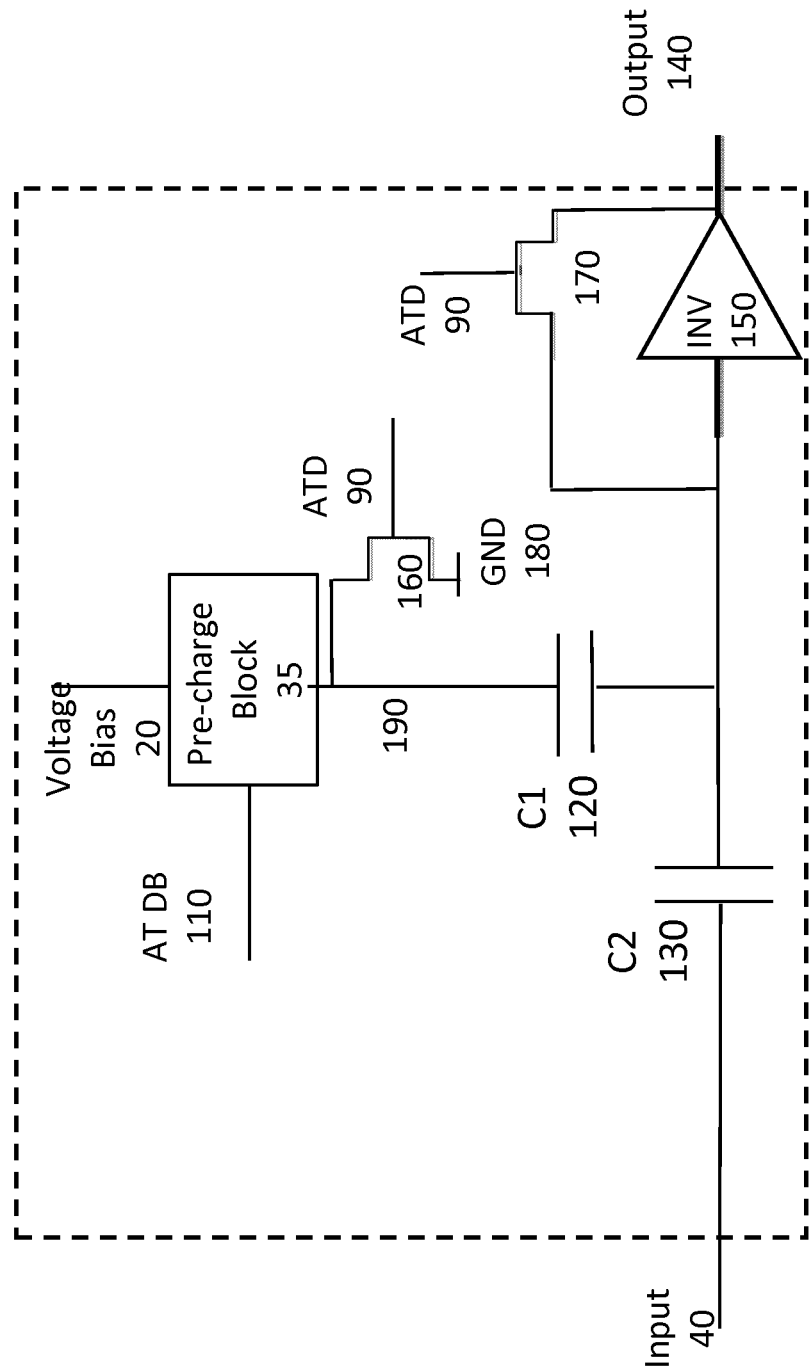
FIG. 2 depicts an embodiment of a timing generator for use with a sense amplifier.

With reference to FIG. 2, an embodiment of timing generator 100 is shown. Timing generator 100 comprises pre-charge block 35, capacitor 120, capacitor 130, transistor 160, transistor 170, and inverter 150. Timing generator 100 receives input 40 (which corresponds to node 40 in FIG. 1). Timing generator 100 generates output 140, which then can be provided to logic control 70 as in FIG. 1 to generate sense amplifier control signal 80.

During operation, when ATD 90 is high, inverter 150 is equalized and node 190 is tied to ground through transistor 160. Input 40 is biased to Voltage Bias 20. After the falling edge of ATD occurs, node 190 is charged high, and the input to inverter 150 is the voltage of node 190 times the ratio of capacitor 120 over capacitor 130 (i.e., C1/C2). Input 40 will be pulled down by the current through reference cell 60, which will further pull down the input to inverter 150 causing output 140 to trigger to a high state. Output 140 will signal the beginning of a sense operation, which logic control 70 will convert into sense amplifier control signal 80.

Figure 3:
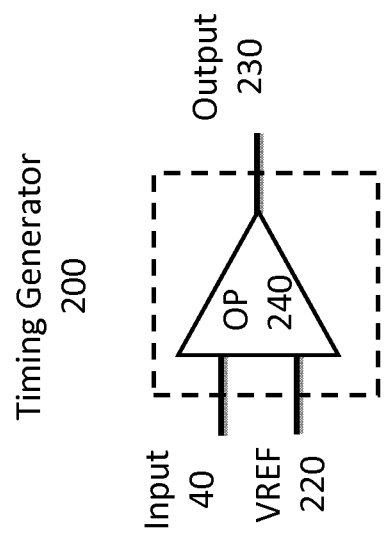
FIG. 3 depicts another embodiment of a timing generator for use with a sense amplifier.

FIG. 3 depicts another embodiment of a timing generator. Timing generator 200 can be used instead of timing generator 100 in the embodiments of FIGS. 1 and 2. Timing generator 200 comprises an operation amplifier 240. The inverting input to operational amplifier 240 is VREF 220, which is a voltage reference. The non-inverting input to operational amplifier 240 is input 40. Output 230 can be input to logic circuit 70 to generate sense amplifier control signal 80.

Figure 4:
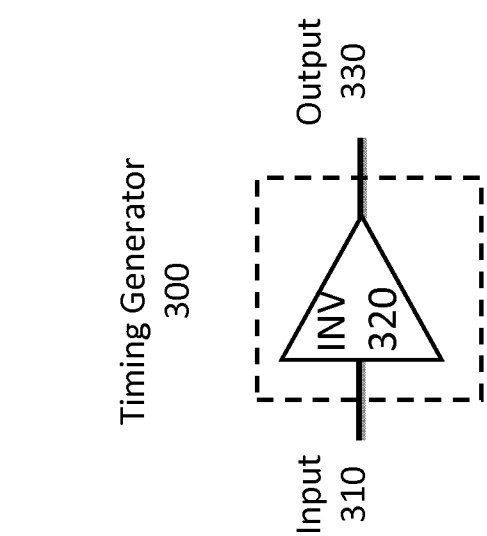
FIG. 4 depicts another embodiment of a timing generator for use with a sense amplifier.

FIG. 4 depicts another embodiment of a timing generator. Timing generator 300 can be used instead of timing generator 100 in the embodiments of FIGS. 1 and 2. Timing generator 300 comprises an inverter 320. The input to the inverter 320 is input 40. The output of inverter 320 is output 330, which can then be input to logic circuit 70 to generate sense amplifier control signal 80.

One of ordinary skill in the art will appreciate that the embodiments described above will improve the performance of read operations for flash memory arrays because the sense operation will be controller by a timing generator that emulates the inherent capacitance of the bit line and reference cell used during a read operation from the flash memory array, References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/ elements there between, as well as forming the element indirectly on the substrate with one or more intermediate materials/elements there between.

What is claimed is:

1. A circuit for generating a sense amplifier control signal, comprising:
    a reference memory cell;
    a multiplexer comprising an input and an output, the input coupled to the reference memory cell;
    a pre-charge block coupled to the output of the multiplexer;
    a timing generator coupled to the output of the multiplexer; and
    logic control coupled to the output of the timing generator to generate a sense amplifier control signal that controls a sense amplifier.

2. The circuit of claim 1, wherein the reference memory cell is a flash memory cell.

3. The circuit of claim 1, wherein the reference memory cell emulates one or more memory cells in a flash memory array.

4. A circuit for generating a sense amplifier control signal, comprising:
    a reference memory cell;
    a multiplexer coupled to the reference memory cell;
    a pre-charge block coupled to the output of the multiplexer;
    a timing generator coupled to the output of the multiplexer; and
    logic control coupled to the output of the timing generator to generate a sense amplifier control signal that controls a sense amplifier;
    wherein the timing generator comprises a plurality of capacitors.

5. The circuit of claim 4, wherein the timing generator comprises an inverter.

6. The circuit of claim 5, wherein the timing generator further comprises a transistor in parallel with the inverter.

7. A method of initiating a sense amplifier operation in a memory system, comprising:
    receiving, by an input of a multiplexer, a first current generated by a reference memory cell;
    generating, at an output of the multiplexer, a second current in response to the first current;
    charging the output of the multiplexer using a pre-charge circuit;
    generating, by a timing generator and logic control, a sense amplifier control signal for controlling a sense amplifier in response to the output of the multiplexer.

8. The method of claim 7, wherein the reference memory cell is a flash memory cell.

9. The method of claim 7, wherein the reference memory cell emulates one or more memory cells in a flash memory array.

10. A method of initiating a sense amplifier operation in a memory system, comprising:
    generating, by a reference memory cell, a current through a node;
    charging the node using a pre-charge circuit; and
    generating, by a timing generator and logic control, a sense amplifier control signal for controlling a sense amplifier in response to the node;
    wherein the timing generator comprises a plurality of capacitors.

11. The method of claim 10, wherein the timing generator comprises an inverter.

12. The method of claim 11, wherein the timing generator comprises a transistor in parallel with the inverter.

13. The method of claim 12, further comprising the step of the transistor equalizing the inverter prior to the generating step.

* * * * *